(12) United States Patent
Chew et al.

(10) Patent No.: US 9,911,712 B2
(45) Date of Patent: Mar. 6, 2018

(54) CLIP AND RELATED METHODS

(71) Applicant: SEMICONDUCTOR COMPONENTS INDUSTRIES, LLC, Phoenix, AZ (US)

(72) Inventors: Chee Hiong Chew, Seremban (MY); Atapol Prajuckamol, Klaeng (TH); Yushuang Yao, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/094,022

(22) Filed: Apr. 8, 2016

(65) Prior Publication Data

US 2017/0117211 A1   Apr. 27, 2017

Related U.S. Application Data

(60) Provisional application No. 62/246,186, filed on Oct. 26, 2015.

(51) Int. Cl.
*H01L 29/73* (2006.01)
*H01L 23/49* (2006.01)
(Continued)

(52) U.S. Cl.
CPC ............. *H01L 24/83* (2013.01); *H01L 24/37* (2013.01); *H01L 24/40* (2013.01); *H01L 25/0655* (2013.01); *H01L 25/072* (2013.01); *H01L 23/49524* (2013.01); *H01L 24/27* (2013.01); *H01L 24/29* (2013.01); *H01L 24/32* (2013.01); *H01L 24/33* (2013.01); *H01L 24/84* (2013.01); *H01L 2224/2732* (2013.01); *H01L 2224/27312* (2013.01); *H01L 2224/27418* (2013.01); *H01L 2224/291* (2013.01); *H01L 2224/293* (2013.01); *H01L 2224/29294* (2013.01); *H01L 2224/32245* (2013.01); *H01L 2224/33181* (2013.01); *H01L 2224/37012* (2013.01); *H01L 2224/3716* (2013.01); *H01L 2224/37111* (2013.01); *H01L 2224/37124* (2013.01); *H01L 2224/37147* (2013.01); *H01L 2224/37155* (2013.01);
(Continued)

(58) Field of Classification Search
CPC ... H01L 29/73; H01L 29/739; H01L 29/7393; H01L 24/83; H01L 23/49; H01L 23/495; H01L 23/49551
USPC ........................................................ 257/676
See application file for complete search history.

(56) References Cited

U.S. PATENT DOCUMENTS 6,175,148 B1   1/2001  Schwarzbauer
6,475,834 B2  11/2002  Embong et al.
(Continued)

*Primary Examiner* — Monica D Harrison
(74) *Attorney, Agent, or Firm* — IPTechLaw

(57) ABSTRACT

A clip for a semiconductor package. Implementations may include: an electrically conductive clip having a first end and a second end and a middle section between the first end and the second end. The first end may be configured to couple to a first die through a bonding material. The second end may be configured to couple to a second die through a bonding material. The middle section may be configured to couple to an emitter structure through a bonding material. The clip may include an integrally formed electrically conductive material and include an M-shape. A middle of the M-shape may be coupled to the emitter structure.

13 Claims, 2 Drawing Sheets

(51) Int. Cl.
*H01L 23/00* (2006.01)
*H01L 25/065* (2006.01)
*H01L 25/07* (2006.01)
*H01L 23/495* (2006.01)

(52) U.S. Cl.
CPC ............... *H01L 2224/40139* (2013.01); *H01L 2224/40175* (2013.01); *H01L 2224/40499* (2013.01); *H01L 2224/73263* (2013.01); *H01L 2224/8384* (2013.01); *H01L 2224/83101* (2013.01); *H01L 2224/83193* (2013.01); *H01L 2224/83385* (2013.01); *H01L 2224/83438* (2013.01); *H01L 2224/83447* (2013.01); *H01L 2224/8484* (2013.01); *H01L 2224/84385* (2013.01); *H01L 2224/84438* (2013.01); *H01L 2224/84447* (2013.01); *H01L 2224/92246* (2013.01); *H01L 2924/00014* (2013.01)

(56) References Cited

U.S. PATENT DOCUMENTS

| | | |
|---|---|---|
| 8,138,600 B2 | 3/2012 | Muto et al. |
| 8,354,733 B2 | 1/2013 | Chang |
| 2010/0289127 A1* | 11/2010 | Kanazawa .......... H01L 21/4842 257/666 |
| 2011/0089558 A1* | 4/2011 | Muto ..................... H01L 24/40 257/712 |
| 2012/0248564 A1* | 10/2012 | Hauenstein ............ H01L 23/34 257/467 |
| 2015/0014740 A1* | 1/2015 | Briere ..................... H02H 7/10 257/133 |

* cited by examiner

CLIP AND RELATED METHODS

CROSS-REFERENCE TO RELATED APPLICATION(S)

This application claims priority to U.S. Provisional Application No. 62/246,186, filed on Oct. 26, 2015, entitled "Clip and Related Methods," invented by Chee Hiong Chew, Atapol Prajuckamol, and Yushuang Yao, and is incorporated herein by reference and priority thereto for common subject matter is hereby claimed.

BACKGROUND

1. Technical Field

Aspects of this document relate generally to semiconductor packages, such as power integrated modules. More specific implementations involve the use of a metal clip to connect die and components within a semiconductor package.

2. Background

Conventionally, to connect dies, such as IGBTs, rectifiers and collectors, within a semiconductor package, aluminum wiring has been used. Such wiring uses wire bonding heads.

SUMMARY

Implementations of a clip for a semiconductor package may include: an electrically conductive clip having a first end and a second end and a middle section between the first end and the second end. The first end may be configured to couple to a first die through a bonding material. The second end may be configured to couple to a second die through a bonding material. The middle section may be configured to couple to an emitter structure through a bonding material. The clip may include an integrally formed electrically conductive material and include an M-shape. A middle of the M-shape may be coupled to the emitter structure.

Implementations of a clip may include one, all, or any of the following:

The integrally formed electrically conductive material may be selected from the group consisting of copper, copper alloy, aluminum, aluminum alloy, steel, brass, nickel, tin, and any combination thereof.

The bonding material may be selected from the group consisting of a solder paste, a solder wire, a preform solder, a sintered Ag metal, a sintered Ag laminate, and any combination thereof.

The first die may be one of an insulated gate bipolar transistor (IGBT) and a rectifier.

The second die may be one of an IGBT and a rectifier.

The second end of the clip may be coupled to a terminal.

The emitter may include silicon.

Implementations of a semiconductor package may include a first collector coupled to a first die through a bonding material, a second collector coupled to a second die through a bonding material, an emitter located between the first collector and the second collector, and an M-shaped clip coupled to the first collector, the second collector, and the emitter through a bonding material. A middle of the M-shape may be coupled to the emitter. The middle of the M-shape may form a convex shape relative to a plane substantially parallel with the first die, the second die, and the emitter.

Implementations of a semiconductor package may include one, all, or any of the following:

The first die may be an insulated gate bipolar transistor (IGBT).

The second die may be a rectifier.

The bonding material may be selected from the group consisting of a solder paste, a solder wire, a preform solder, a sintered Ag metal, a sintered Ag laminate, and any combination thereof.

The M-shaped clip may include at least one of copper, copper alloy, aluminum, aluminum alloy, steel, brass, nickel, tin, and any combination thereof.

The middle of the M-shape may be located below a top surface of the first die and a top surface of the second die.

Implementations of semiconductor packages may be manufactured using implementations of a method of making a semiconductor package. The method may include patterning and etching a substrate to form a first collector, a second collector, and an emitter therein where the emitter is located between the first collector and the second collector. The method may also include applying bonding material to the first collector, the second collector, and the emitter and coupling a first die to the first collector and a second die to the second collector. The method may also include applying bonding material to the first die and to the second die. The method may also include simultaneously mechanically and electrically coupling the first collector, the second collector, and the emitter through bonding an integrally formed clip comprising an M-shape to the first die, the second die, and the emitter through the bonding material.

Implementations of a method of making a semiconductor package may include one, all, or any of the following:

The substrate may include at least one of copper, silicon, and any combination thereof.

The bonding material may be selected from the group consisting of a solder paste, a solder wire, a preform solder, a sintered Ag metal, a sintered Ag laminate, and any combination thereof.

The clip may include an electrically conductive material selected from the group consisting of copper, copper alloy, aluminum, aluminum alloy, steel, brass, nickel, tin, and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended clip for a semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such a clip, and implementing components and methods, consistent with the intended operation and methods.

Figure 1:
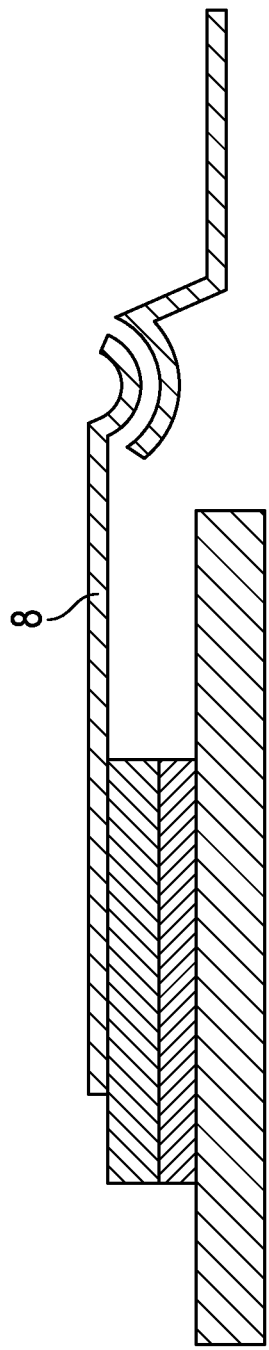
FIG. 1 is a side view of a conventional clip.
Figure 2:
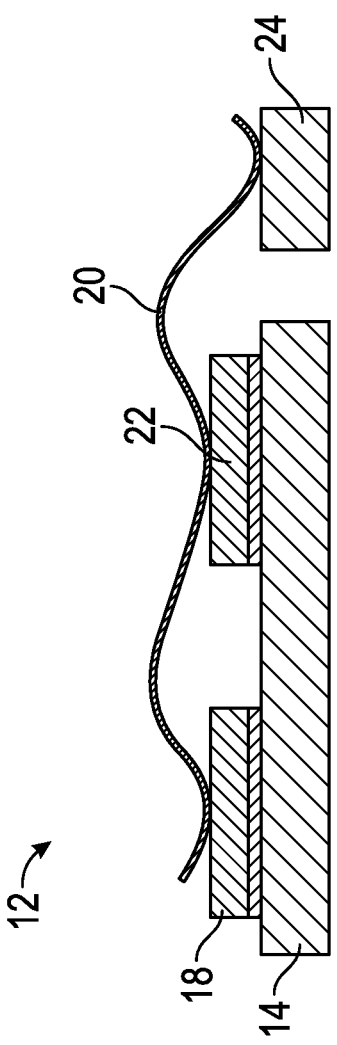
FIG. 2 is a side view of a conventional method of connecting dies with aluminum wire.

FIG. 1 illustrates an implementation of a conventional semiconductor clip 8 where the clip 8 is made of two separate pieces connected through a bonding material during the assembly process. FIG. 2 illustrates a conventional semiconductor package 12. The conventional method of connecting die 18 and 22 in a semiconductor package 12 uses an aluminum wire 20 wire bonded to each of the die 18, 22, and the emitter 24. In the conventional method, the emitter 24 is to the side of the collector 14 and connected die 18 and 22 rather than in between the die 18 and 22. The use of aluminum wire in connecting the components of the semiconductor package may have significant drawbacks including the limiting and localization of current flow, leading to hotspots at the contact sites of the wire and the die, reliability failures due to cracking of the wire bond joints between the wire and the die, and limiting the high current capability of IGBTs.

Figure 3:
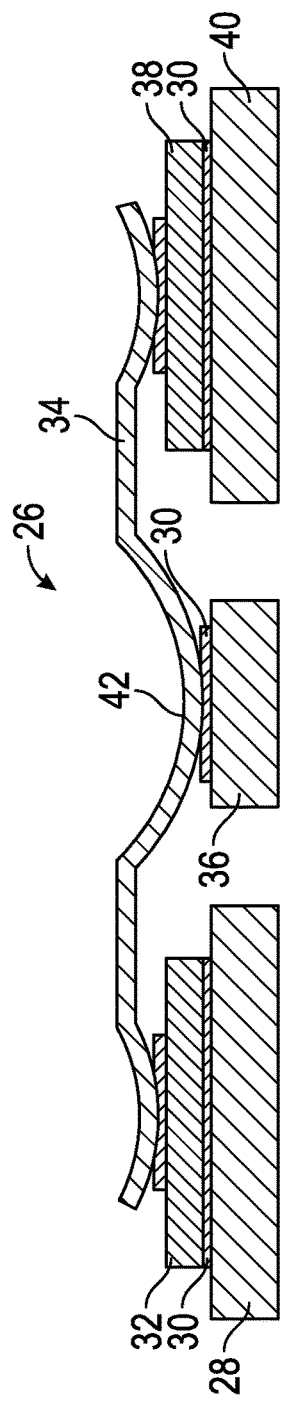
FIG. 3 is a side view of an implementation of a clip connecting semiconductor die and emitters.

Referring to FIG. 3, an implementation of a semiconductor package 26 where the collectors 28 and 40 are connected to the emitter 36 through a rigid electrically conductive clip 34 is illustrated. The clip 34 is integrally formed of an electrically conductive material and has, when viewed from the side, an M-shape. The shape of the clip 34 is such that it has a convex curvature 42 relative to a plane formed by the of the collectors 28 and 40 (first and second collectors, respectively) at the point of connection to the die 32 and 38 (first and second die, respectively) and the point of connection to the emitter 36. The M-shape of the clip 34 is created by the convex curvature of the clip 34 connected to the emitter 36 being lower than the plane of dies 32 and 38. Each collector is connected to a die 32, 38 through bonding material 30 and each die 32,38 is connected to the clip 34 through bonding material 30. In this implementation the emitter 36 is capable of being located between the dies 32 and 38. The die 32 and 38 can include, by non-limiting example, an insulated gate bipolar junction transistor (IGBT) a rectifier, a metal oxide field effect transistor (MOSFET), or any other semiconductor device. The bonding material 30 that can be used can include by non-limiting example, a solder paste, a solder wire, a preform solder, a sintered silver metal, a sintered silver laminate or any combination of the foregoing. The bonding material may be applied to the die 32, 38 and to the collectors 28, 40 and the emitter 36 through any of a wide variety of conventional techniques, including, by non-limiting example, dispensing, spray dispensing, stencil printing, and the like.

Figure 4:
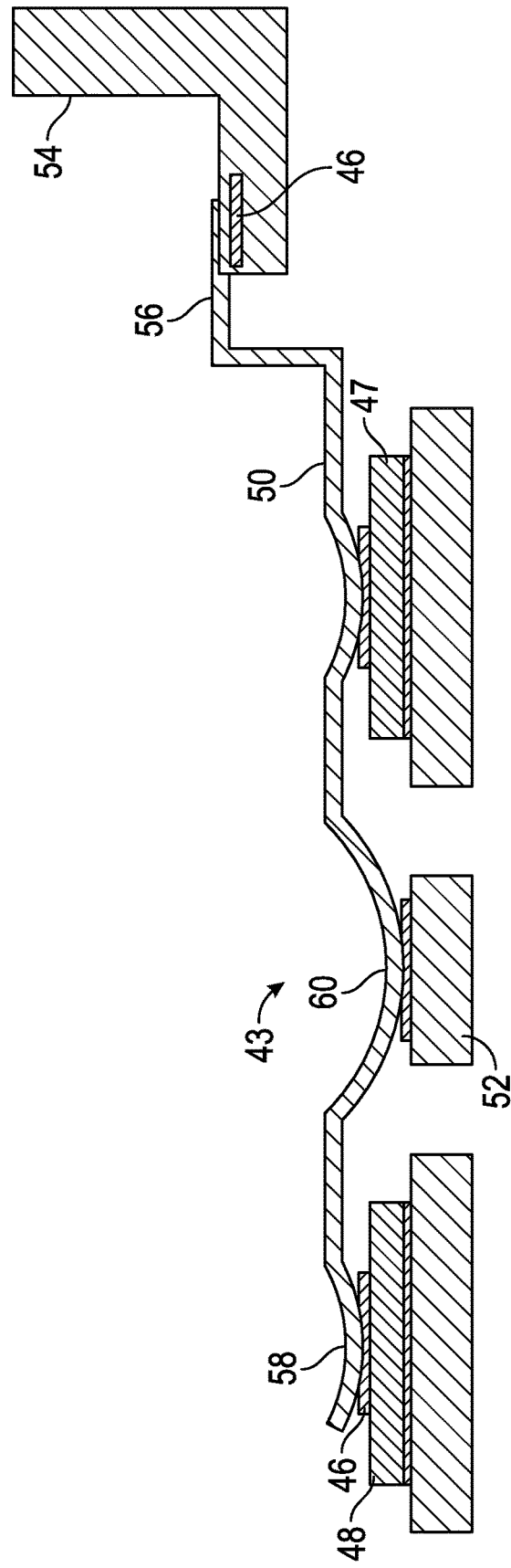
FIG. 4 is a side view of another implementation of a clip including connection to a terminal.

Referring to FIG. 4, another implementation of a clip 50 is illustrated where the semiconductor package 43 includes a connection of the die 48 and 47 and emitter 52 to a terminal 54. This connection is achieved through coupling a second end 56 of the clip 50 to the terminal 54 the use of the clip 50 while a first end 58 of the clip 50 is coupled to the die 48. The middle section of the clip 60 is coupled to the emitter 52. The clip 50 in this implementation extends past the connection to the die 47 and the second end is shaped with an upwardly bent shape in order to reach terminal 54. The clip 50 is coupled to the terminal through a bonding material 46.

Clip implementations disclosed herein may be made of any electrically conductive material capable of carrying current between each component of the semiconductor package and mechanically holding its shape. These may include, in various implementations, copper, copper alloy, aluminum, aluminum alloy, steel, brass, nickel, tin, or any combination of these materials. The clip may be in the shape of an "M." This shape is achieved by having a convex curvature in a middle section of the clip in order to allow the middle section to make contact with a portion of the package between the first end and second end of the clip while still being a single integral piece. Clip implementations may be made by a variety of techniques, including, by non-limiting example, bending, casting, molding, and any other method for integrally forming a metal or other electrically conductive material.

Semiconductor packages that utilize clip implementations like those disclosed herein may be formed using various implementations of methods of manufacturing semiconductor packages. In such method implementations, the method includes patterning and etching a substrate to form a first collector, second collector, and an emitter where the emitter is located between the first collector and the second collector. This patterning and etching can be done using a wide variety of conventional techniques including photolithography, wet etching, dry etching, electroplating, and the like. The substrate can include in whole or in part copper, silicon, or any combination thereof. The method also includes applying bonding material to the first collector, second collector, and the emitter and coupling a first die to the first collector and a second die to the second collector. The bonding material may be any disclosed in this document. The method also includes simultaneously mechanically and electrically coupling the first collector, the second collector, and the emitter through bonding the clip including the M-shape to the first die, the second die, and the emitter through the bonding material. As the clip contacts the die and the emitter, it simultaneously connects the components. It also allows the emitter to be located between the first collector and second collector due to the M-shape of the clip.

Various conventional clip designs use multiple pieces to form a single clip to make contact with the semiconductor components. Examples of such conventional designs may be found in U.S. Pat. No. 8,354,733 to Chang, Hsuch-Rong, entitled "IGBT Power Semiconductor Package Having a Conductive Clip," issued Jan. 15, 2013; U.S. Pat. No. 6,475,834 to Embong et al. entitled "Method of Manufacturing a Semiconductor Component and Semiconductor Component Thereof," issued Nov. 5, 2002; U.S. Pat. No. 8,138,600 to Muto et al. entitled "Semiconductor Device and Method of Manufacturing the Same," issued Mar. 20, 2012; and U.S. Pat. No. 6,175,148 to Schwarzbauer, Herbert entitled "Electrical Connection for a Power Semiconductor Component," issued Jan. 16, 2001; the disclosures of each of which are hereby incorporated entirely herein by reference.

In particular implementations, the clip may have more rigidity than a corresponding aluminum wire. This rigidity of the clip may aid in keeping the various components separated from each other and maintaining a low profile within the semiconductor package. Copper may be a good material for the construction of clip implementations because it has higher thermal and electrical conductivity than traditional materials used in semiconductor manufacturing. The clip made of copper can be thicker than the aluminum wire conventionally used, permitting the clip to carry more current while maintaining a cooler temperature leading to less risk of hot spots and metal fatigue. In various implementations, the use of clip implementations like those disclosed herein in semiconductor packages eliminates the need for wire bonds because the clip is connected to the dies directly through the bonding material. This direct connection may also allow for a better flow of current within the device.

In places where the description above refers to particular implementations of a clip for a semiconductor package and implementing components, sub-components, methods and sub-methods, it should be readily apparent that a number of modifications may be made without departing from the spirit thereof and that these implementations, implementing components, sub-components, methods and sub-methods may be applied to other clips.

What is claimed is:

1. A clip for a semiconductor package comprising:
   an electronically conductive clip having a first end and a second end and a middle section between the first end and the second end;
   wherein the first end is configured to couple to a first die through a bonding material;
   wherein the second end is configured to couple to a second die through a bonding material;
   wherein the middle section is configured to couple to an emitter structure through a bonding material, the emitter structure physically separate from the first die and from the second die;
   wherein the clip comprises an integrally formed electrically conductive material and comprises an M-shape;
   wherein the second end is adjacent to the middle section and is opposite the first end;
   wherein a middle of the M-shape is coupled to the emitter structure.

2. The clip of claim 1, wherein the integrally formed electrically conductive material is selected from the group consisting of copper, copper alloy, aluminum, aluminum alloy, steel, brass, nickel, tin and any combination thereof.

3. The clip of claim 1, wherein the bonding material is selected from the group consisting of a solder paste, a solder wire, a preform solder, a sintered Ag metal, a sintered Ag laminate, and any combination thereof.

4. The clip of claim 1, wherein the first die is one of an insulated gate bipolar transistor (IGBT) and a rectifier.

5. The clip of claim 1, wherein the second die is one of an IGBT and a rectifier.

6. The clip of claim 1, wherein the second end of the clip extends past the second die and is configured to couple is coupled to a terminal.

7. The clip of claim 1, wherein the emitter is comprised of silicon.

8. A semiconductor package comprising:
   a first collector coupled to a first die through a bonding material;
   a second collector coupled to a second die through a bonding material;
   an emitter located between the first collector and the second collector; and
   an M-shaped clip coupled to the first collector, the second collector, and the emitter through a bonding material;
   wherein a middle of the M-shape is coupled to the emitter; and
   wherein the middle of the M-shape forms a convex shape relative to a plane substantially parallel with the first die, the second die, and the emitter.

9. The package of claim 8, wherein the first die is an insulated gate bipolar transistor (IGBT).

10. The package of claim 8, wherein the second die is a rectifier.

11. The package of claim 8, wherein the bonding material is selected from the group consisting of a solder paste, a solder wire, a preform solder, a sintered Ag metal, a sintered Ag laminate, and any combination thereof.

12. The package of claim 8, wherein the M-shaped clip comprises at least one of copper, copper alloy, aluminum, aluminum alloy, steel, brass, nickel, tin, and any combination thereof.

13. The package of claim 8, wherein the middle of the M-shape is located below a top surface of the first die and a top surface of the second die.

* * * * *

UNITED STATES PATENT AND TRADEMARK OFFICE
CERTIFICATE OF CORRECTION

PATENT NO.        : 9,911,712 B2
APPLICATION NO.   : 15/094022
DATED             : March 6, 2018
INVENTOR(S)       : Chee Hiong Chew, Atapol Prajuckamol and Yushuang Yao Page 1 of 1

It is certified that error appears in the above-identified patent and that said Letters Patent is hereby corrected as shown below:

In the Claims

Claim 6, Column 6, Lines 6-7, after 'configured to couple' delete "is coupled"

Signed and Sealed this
Tenth Day of April, 2018

Andrei Iancu
*Director of the United States Patent and Trademark Office*